United States Patent
Bai et al.

(10) Patent No.: US 11,322,686 B2
(45) Date of Patent: May 3, 2022

(54) MASK HAVING SHIELDING PART WITHIN OPENING AND MANUFACTURING METHOD THEREOF, EVAPORATION METHOD AND DISPLAY SCREEN WITH ACTIVE AREA SURROUNDING FUNCTIONAL COMPONENT AREA

(71) Applicant: BOE Technology Group Co., Ltd., Beijing (CN)

(72) Inventors: Shanshan Bai, Beijing (CN); Kuo Sun, Beijing (CN); Qiaonan Han, Beijing (CN); Dongmei Xie, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 187 days.

(21) Appl. No.: 16/619,277

(22) PCT Filed: Jun. 21, 2019

(86) PCT No.: PCT/CN2019/092398
§ 371 (c)(1),
(2) Date: Dec. 4, 2019

(87) PCT Pub. No.: WO2020/001387
PCT Pub. Date: Jan. 2, 2020

(65) Prior Publication Data
US 2020/0357998 A1    Nov. 12, 2020

(30) Foreign Application Priority Data

Jun. 29, 2018 (CN) .......................... 201810713053.6

(51) Int. Cl.
*H01L 29/08* (2006.01)
*H01L 51/00* (2006.01)
(Continued)

(52) U.S. Cl.
CPC .......... *H01L 51/001* (2013.01); *C23C 14/042* (2013.01); *C23C 14/24* (2013.01);
(Continued)

(58) Field of Classification Search
CPC ...................................................... H01L 51/001
See application file for complete search history.

(56) References Cited

U.S. PATENT DOCUMENTS 8,273,179 B2 * 9/2012 Kim ........................ B32B 3/266
                                                              118/721
8,598,783 B2 * 12/2013 Yamaguchi ......... H01L 51/0035
                                                              313/504
(Continued)

FOREIGN PATENT DOCUMENTS

CN     205954096 U    2/2017
CN     106648417 A    5/2017
(Continued)

OTHER PUBLICATIONS

Chinese Office Action for corresponding application 201810713053.6 dated Jul. 31, 2019.

*Primary Examiner* — Caleb E Henry
(74) *Attorney, Agent, or Firm* — ArentFox Schiff LLP; Michael Fainberg (57) ABSTRACT

The present disclosure provides a mask and a manufacturing method thereof, an evaporation method and a display screen, to achieve normal display of an area around such components as an earpiece, a front camera, and sensors on the front of a display screen, and increase the screen-to-body ratio. The mask comprises a substrate provided with at least one opening, an orthographic projection of the opening on a display plane of a display screen to be fabricated coinciding with a display area of the display screen to be fabricated; a shielding part arranged inside the opening, an orthographic projection of the shielding part on the display plane coin- (Continued)

ciding with an orthographic projection of a component to be shielded in the display screen to be fabricated on the display plane; and a connecting part located between the shielding part and a side wall of the opening.

20 Claims, 9 Drawing Sheets

(51) Int. Cl.
    *C23C 14/04*     (2006.01)
    *C23C 14/24*     (2006.01)
    *H01L 51/52*     (2006.01)

(52) U.S. Cl.
    CPC ...... *H01L 51/0011* (2013.01); *H01L 51/5203* (2013.01); *H01L 51/5253* (2013.01)

(56) References Cited

U.S. PATENT DOCUMENTS

| | | | | |
|---|---|---|---|---|
| 8,646,406 | B2* | 2/2014 | Ahn | G03F 1/20 |
| | | | | 118/505 |
| 9,657,392 | B2* | 5/2017 | Han | B05C 21/005 |
| 9,953,828 | B2* | 4/2018 | Oh | H01L 21/02104 |
| 10,128,440 | B2* | 11/2018 | Lee | H01L 51/0011 |
| 10,437,144 | B2* | 10/2019 | Zhang | C23C 14/12 |
| 2003/0221614 | A1* | 12/2003 | Kang | C23C 14/042 |
| | | | | 118/504 |
| 2004/0202821 | A1* | 10/2004 | Kim | B32B 3/266 |
| | | | | 428/137 |
| 2007/0236134 | A1* | 10/2007 | Ho | H01L 27/3213 |
| | | | | 313/500 |
| 2007/0266943 | A1 | 11/2007 | Yeh et al. | |
| 2011/0067630 | A1* | 3/2011 | Ko | C23C 14/042 |
| | | | | 118/721 |
| 2015/0022078 | A1* | 1/2015 | Huang | H01L 27/3218 |
| | | | | 313/504 |
| 2016/0063706 | A1* | 3/2016 | Gonzalez-Banos | G06T 7/20 |
| | | | | 348/222.1 |
| 2016/0254327 | A1* | 9/2016 | Bai | H01L 27/12 |
| | | | | 257/40 |
| 2016/0329385 | A1* | 11/2016 | Qiu | H01L 27/3216 |
| 2017/0025611 | A1* | 1/2017 | Huang | H01L 51/0011 |
| 2017/0133440 | A1* | 5/2017 | Wang | H01L 51/0011 |
| 2017/0194389 | A1* | 7/2017 | Guo | H01L 27/3218 |
| 2018/0155818 | A1* | 6/2018 | Mu | C23C 14/12 |
| 2019/0093216 | A1* | 3/2019 | Zhou | C23C 16/042 |
| 2019/0123115 | A1 | 4/2019 | Sun et al. | |
| 2019/0148468 | A1 | 5/2019 | Jia et al. | |

FOREIGN PATENT DOCUMENTS

| | | |
|---|---|---|
| CN | 107658332 A | 2/2018 |
| CN | 107682481 A | 2/2018 |
| CN | 107740065 A | 2/2018 |
| CN | 107786696 A | 3/2018 |
| CN | 107829065 A | 3/2018 |
| CN | 107887423 A | 4/2018 |
| CN | 108417172 A | 8/2018 |
| CN | 108866476 A | 11/2018 |

* cited by examiner

Arrangement of sub-pixels    Grid structure of the connecting part

MASK HAVING SHIELDING PART WITHIN OPENING AND MANUFACTURING METHOD THEREOF, EVAPORATION METHOD AND DISPLAY SCREEN WITH ACTIVE AREA SURROUNDING FUNCTIONAL COMPONENT AREA

The present disclosure is a US National Stage of International Application No. PCT/CN2019/092398, filed on Jun. 21, 2019, which claims priority to Chinese patent publication No. 201810713053.6, filed with Chinese Patent Office on Jun. 29, 2018, entitled "MASK AND MANUFACTURING METHOD THEREOF, EVAPORATION METHOD AND DISPLAY SCREEN", which is incorporated herein by reference in its entirety.

FIELD

The present disclosure relates to the field of display technology, and in particular, relates to a mask and a manufacturing method thereof, an evaporation method and a display screen.

BACKGROUND

At present, "full screen" technology is a hot spot in the mobile phone industry. In theory, a "full screen" means that the front of the mobile phone is all a screen, with a bezel-less design for four border positions of the mobile phone, in pursuit of a screen-to-body ratio close to 100%. In fact, however, the so-called "full screen" in the industry now is not a full screen in the true sense, but merely a screen with a high screen-to-body ratio. An upper end of such a screen is provided with a specific area, in which an earpiece, a front camera, sensors, and other components that need to be arranged on the front of the screen are arranged. This area can not be used for normal display, which causes the screen to be commonly known as a "full screen with a notch".

From the perspective of aesthetics and technology, the "notch" will be inevitably eliminated in the future. To achieve a true "full screen" design with a screen-to-body ratio of 99% or higher, an earpiece, a front camera, and various sensors including a distance sensor need to be placed under the screen of the mobile phone, so that normal display can be achieved in areas around such devices, but such technology is still difficult to implement at present.

SUMMARY

In view of the situations of the prior art, embodiments of the present disclosure provide a mask and a manufacturing method thereof, an evaporation method and a display substrate, to achieve normal display of an area around such components as an earpiece, a front camera, and sensors on the front of a display screen, and increase the screen-to-body ratio.

To achieve the above object, embodiments of the present disclosure adopt the following technical solutions.

In a first aspect, an embodiment of the present disclosure provides a mask. The mask includes a substrate provided with at least one opening, an orthographic projection of the opening on a display plane of a display screen to be fabricated coinciding with a display area of the display screen to be fabricated; a shielding part arranged inside the opening, an orthographic projection of the shielding part on the display plane coinciding with an orthographic projection of a component to be shielded in the display screen to be fabricated on the display plane; and a connecting part located between the shielding part and a side wall of the opening, for connecting the shielding part and the side wall of the opening.

Based on the above technical solution, optionally, the connecting part has a grid structure.

Optionally, an orthographic projection of each mesh of the grid structure on the display plane covers at least one sub-pixel on the display screen to be fabricated, and an orthographic projection of a physical portion of the grid structure on the display plane is in a gap area between sub-pixels on the display screen to be fabricated.

Optionally, a physical portion between two adjacent meshes in the grid structure has a notch connecting the two adjacent meshes.

Optionally, the connecting part is an integral structure and is an axisymmetric structure, and a symmetry axis of the connecting part passes through a center of the shielding part and is perpendicular to the side wall of the opening connected by the connecting part; and the width of an end of the connecting part connected to the shielding part is smaller than or equal to a maximum width of the shielding part along a direction perpendicular to the symmetry axis of the connecting part, and the width of an end of the connecting part connected to the side wall of the opening is larger than or equal to the width of the end of the connecting part connected to the shielding part.

Optionally, the connecting part includes at least two independent sub-connecting parts and is an axisymmetric structure, and a symmetry axis of the connecting part passes through a center of the shielding part and is perpendicular to the side wall of the opening connected by the connecting part; and the at least two sub-connecting parts are arranged symmetrically about the symmetry axis; and the width of an end of each sub-connecting part connected to the side wall of the opening is larger than or equal to the width of an end of the sub-connecting part connected to the shielding part.

Optionally, the connecting part is connected with a side wall of the opening closest to the shielding part.

Optionally, the substrate, the shielding part and the connecting part are an integral structure.

Optionally, the shape of the orthographic projection of the shielding part on the display plane is same as the that of the orthographic projection of the component to be shielded in the display screen to be fabricated on the display plane, and the area of the orthographic projection of the shielding part on the display plane is equal to or slightly larger than that of the orthographic projection of the component to be shielded in the display screen to be fabricated on the display plane.

In a second aspect, an embodiment of the present disclosure provides a manufacturing method of a mask. The manufacturing method includes: providing a substrate; and removing a specific portion from the substrate to form at least one opening on the substrate and form a shielding part and a connecting part inside the opening, where an orthographic projection of the opening on a display plane of a display screen to be fabricated coincides with a display area of the display screen to be fabricated, and an orthographic projection of the shielding part on the display plane coincides with an orthographic projection of a component to be shielded in the display screen to be fabricated on the display plane, and the connecting part connects the shielding part and a side wall of the opening.

Based on the above technical solution, optionally, the step of removing a specific portion from the substrate to form at least one opening on the substrate and form a shielding part and a connecting part inside the opening includes: removing a portion of the substrate in an area in which an opening is to be formed, except for areas in which a shielding part and a connecting part are to be formed, by a wet etching process or a laser etching process, and making meshes in the area in which the connecting part is to be formed to form the at least one opening, the shielding part, and the connecting part having a grid structure; or, removing a portion of the substrate in an area in which an opening is to be formed, except for areas in which a shielding part and a connecting part are to be formed, by a wet etching process, to form the at least one opening, the shielding part, and a rudiment of the connecting part; and etching the rudiment of the connecting part by a laser etching process, and making meshes in the rudiment of the connecting part, to obtain the connecting part having a grid structure.

In a third aspect, an embodiment of the present disclosure provides an evaporation method. The evaporation includes at least two evaporation operations, and a mask in any of the first, second and third optional solutions in the first aspect is used in each evaporation operation, and the mask is moved a set distance along a set direction after each evaporation operation and before the next evaporation operation, where the set direction and the set distance depend on the arrangement of meshes in a grid structure of a connecting part in the mask, so that after the at least two evaporation operations are performed, evaporated film layers formed through the meshes are connected with each other, and evaporated film layers formed through the connecting part are connected with evaporated film layers formed through an area in the opening except for the connecting part and a shielding part.

Based on the above technical solution, optionally, a sum of thicknesses of film layers evaporated by the at least two evaporation operations is a designed thickness of the film layer.

Optionally, the evaporation method includes two evaporation operations, and a film thickness in each evaporation operation is half the designed thickness of the film layers.

In a fourth aspect, an embodiment of the present disclosure provides a display screen. The display screen includes an active area and a functional component area, where a functional component of the display screen is arranged in the functional component area, the shape of the functional component area is same as that of an orthographic projection of the functional component arranged therein on a display plane, and the area of the functional component area is equal to or slightly larger than that of the orthographic projection of the functional component arranged therein on the display plane; and the active area surrounds the functional component area.

Based on the above technical solution, optionally, an electrode layer is provided in the active area; the active area comprises a connecting transitional sub-area located between the functional component area and a side of the active area closest thereto; and the electrode layer comprises at least two sub-electrode layers arranged in a stacked manner, where in the connecting transitional sub-area, each sub-electrode layer comprises a plurality of electrodes spaced apart from each other, and the plurality of electrodes of the same sub-electrode layer are arranged in gaps between the plurality of electrodes of the adjacent sub-electrode layer, so that the electrodes in the connecting transitional sub-area are electrically connected with each other; or in the connecting transitional sub-area, the electrode layer comprises a plurality of electrodes spaced apart from each other, and adjacent electrodes are electrically connected through electrode segments, so that the plurality of electrodes are electrically connected with each other.

BRIEF DESCRIPTION OF THE DRAWINGS

To more clearly describe technical solutions in the embodiments of the present disclosure or in the prior art, a brief introduction to the drawings for use in description of the embodiments or the prior art will be given below. Apparently, the drawings described below are only some embodiments of the present disclosure, and to those of ordinary skill in the art, other drawings may also be obtained based on these drawings without creative effort.

DETAILED DESCRIPTION OF EMBODIMENTS

To make the above objects, features and advantages of the present disclosure more apparent and easily understood, a clear and complete description of the technical solutions in the embodiments of the present disclosure will be given below in conjunction with the drawings in the embodiments of the present disclosure. Obviously, the embodiments described are part of, rather than all of, the embodiments of the present disclosure. All other embodiments obtained by those of ordinary skill in the art without creative effort, based on the embodiments of the present disclosure fall into the protection scope of the present disclosure.

Figure 1:
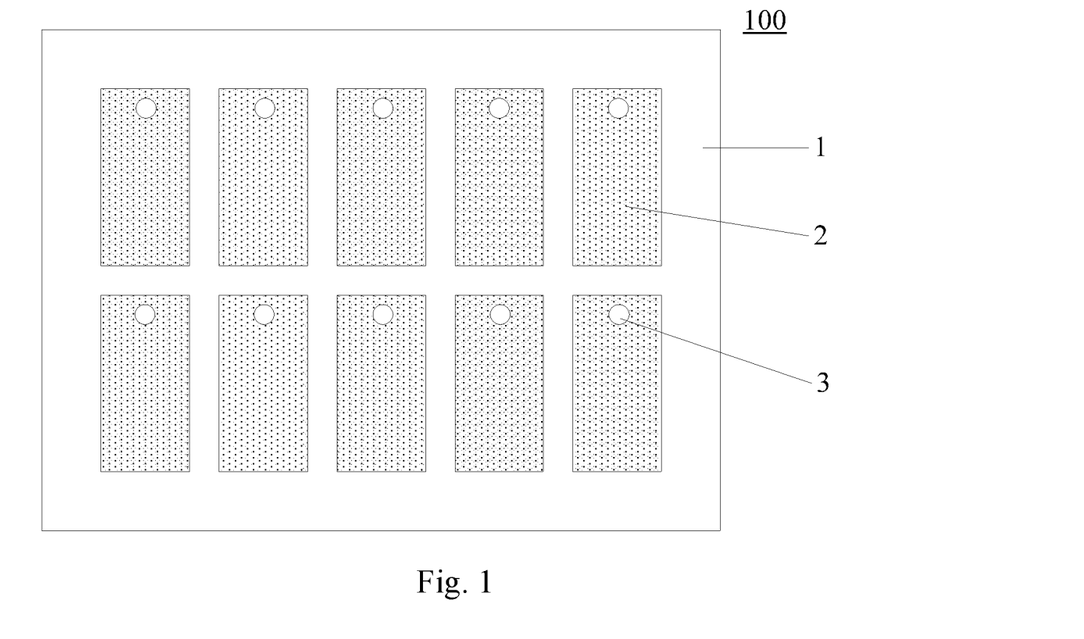
FIG. 1 is a plan view of a display screen motherboard of a full screen as envisioned.

As described in the background part, the so-called "full screen" in the industry at present is not a full screen in the true sense, but a "full screen with a notch". Eliminating the "notch" is now an urgent problem to be solved. In an envisaged solution, to eliminate the "notch", functional components on the front of the screen, such as a camera, need to be arranged in an effective display area of the front of the screen. Refer to FIG. 1, which shows a display screen mother board 100, and taking the display screen mother board 100 being an OLED (Organic Light-Emitting Diode) display device as an example, where the numeral 2 represents an evaporation area corresponding to an effective display area of a display screen, a through hole area 3 needs to be provided in the evaporation area 2, and functional components (such as a camera) on the front of the screen is arranged in the through hole area 3, which means that an EL (Electro Luminescence) material for the OLED device cannot be evaporated into the through hole area 3 in an evaporation process.

Figure 2:
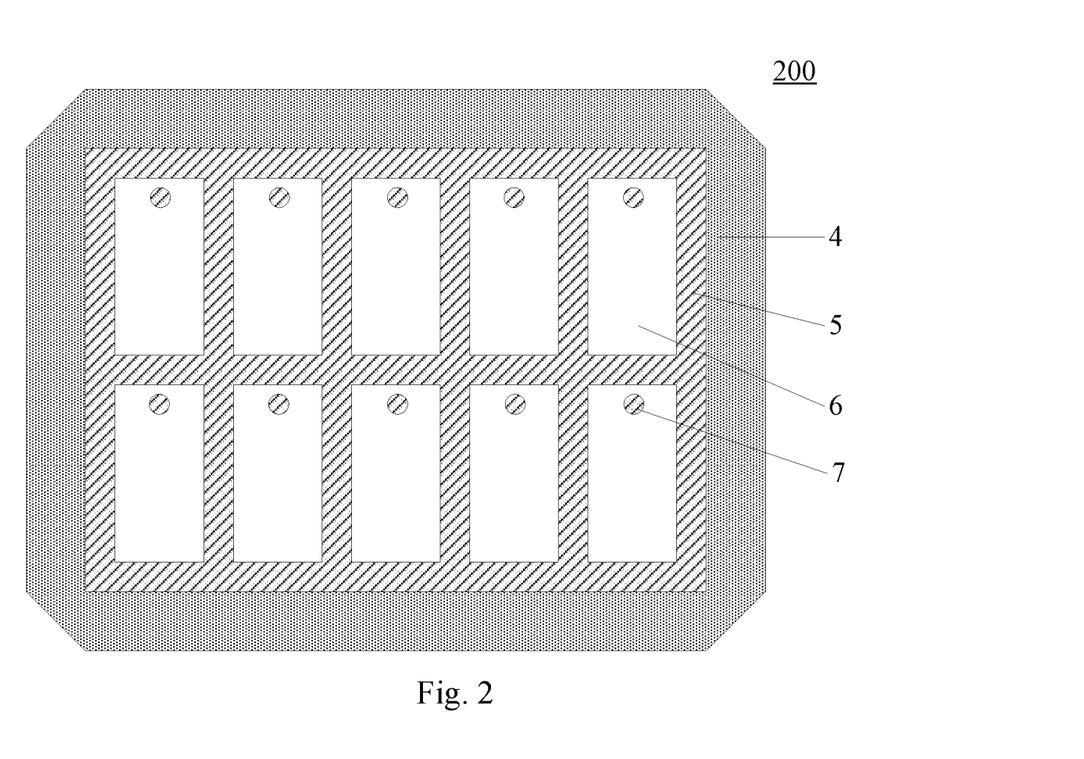
FIG. 2 is a plan view of a structure of a mask of a full screen as envisioned.

Based on this, see FIG. 2, which shows a mask for evaporating an EL material, where the numeral 4 represents a metal frame, 5 represents a substrate, and 6 represents an opening corresponding to the effective display area of the screen, i.e. the evaporation area 2. To prevent the EL material from being evaporated into the effective display area, an area corresponding to the through hole area 3, i.e. a shield area 7 shown in FIG. 2, needs to be shielded in the opening 6. This requires, however, the shielding component should be suspended in the opening 6, and the technical demand cannot be met at present.

Figure 3:
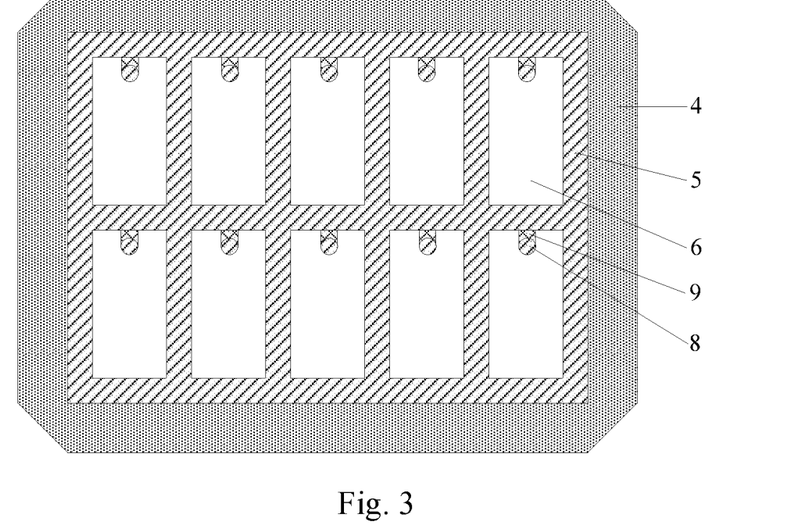
FIG. 3 is a plan view of a structure of a mask provided in an embodiment of the present disclosure.

Based on the above, a mask 300 is provided in embodiments of the present disclosure. As shown in FIG. 3, the mask 300 includes a substrate 5, a shielding part 8 and a connecting part 9. The substrate 5 is provided with at least one opening 6, and an orthographic projection of the opening 6 on a display plane of a display screen to be fabricated coincides with a display area of the display screen to be fabricated during evaporation; the shielding part 8 is arranged inside the opening 6, and an orthographic projection of the shielding part 8 on the display plane coincides with an orthographic projection of a component, such as a camera, an earpiece or other functional component, to be shielded in the display screen to be fabricated on the display plane during evaporation; and the connecting part 9 connects the shielding part 8 and a side wall of the opening 6, for supporting the shielding part 8.

In the mask 300 provided in the embodiments, the shielding part 8 is arranged inside the opening 6 of the mask 300, and the shielding part 8 is fixed in the opening 6 by the connecting part 9. When the above mask 300 is used for evaporation, the shielding part 8 can shield the component (such as a camera, an earpiece, a sensor or the like) to be shielded in the display screen, thereby avoiding deposition of the evaporation material on the component. An area around such a component is not shielded, and thus evaporation of film layers can be carried out normally there, so that display can be implemented in the area around the component, and the screen-to-body ratio is increased, thus achieving a full screen design.

It needs to be noted that the mask 300 provided in the embodiments is suitable for evaporating functional film layers of a light emitting device in an OLED display device, such as an electron injection layer, an electron transport layer, a hole injection layer, a hole transport layer, a cathode layer, and the like. Evaporation materials required for the functional film layers can be collectively referred to as EL materials. In a common design, the functional film layers are generally an entire layer of film, and thus can be evaporated by using the mask 300 in the embodiments. The mask 300 in the embodiments is called an Open Mask.

Based on the above technical solution, as shown in FIGS. 4a-4d, as an optional solution, the connecting part 9 in the mask 300 can have a grid structure, so that a shielding area of the connecting part 9 can be reduced, and the evaporation material can be evaporated into the display area corresponding to the connecting part 9 through meshes of the grid structure of the connecting part 9, thus achieving normal display in the display area corresponding to the connecting part 9, and further increasing the screen-to-body ratio.

Figure 4A:
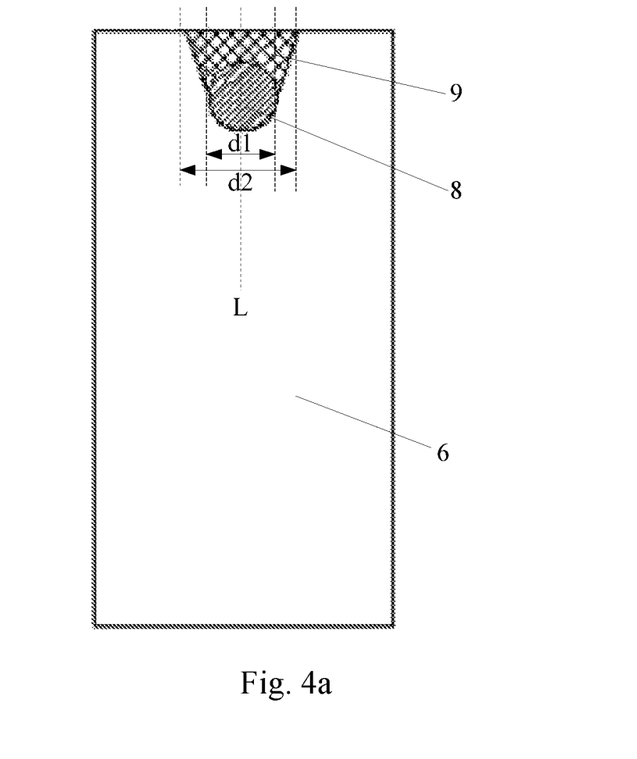
FIGS. 4a-4d are plan views of a structure of a single display unit of a mask provided in an embodiment of the present disclosure.

Exemplarily, as shown in FIG. 4a, the connecting part 9 is an integral structure and is an axisymmetric structure, and a symmetry axis L of the connecting part 9 passes through a center of the shielding part 8 and is perpendicular to the side of the opening 6 connected by the connecting part 9. The width d1 of an end of the connecting part 9 connected to the shielding part 8 is smaller than or equal to a maximum width of the shielding part 8 along a direction perpendicular to the symmetry axis L of the connecting part 9, and the width d2 of an end of the connecting part 9 connected to the side wall of the opening 6 is larger than the width d1 of the end of the connecting part 9 connected to the shielding part 8. In such a structure, the connecting part 9 is an axisymmetric structure, and can be regarded as in a quasi-trapezoidal shape, so that the supporting force provided by the connecting part 9 to the shielding part 8 is relatively symmetrical, and the connection between the shielding part 8 and the side wall of the opening 6 is relatively stable.

Figure 4B:
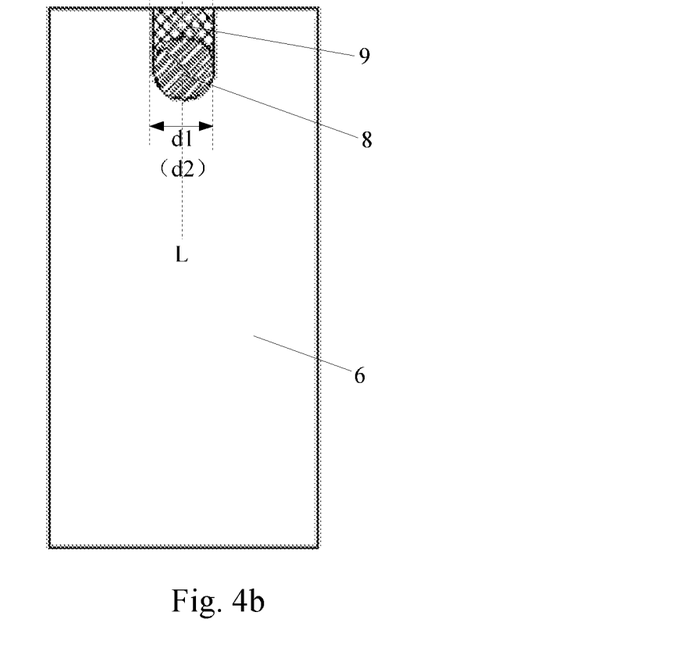

Exemplarily, as shown in FIG. 4b, the connecting part 9 is an integral and axisymmetric structure, and a symmetry axis L of the connecting part 9 passes through a center of the shielding part 8 and is perpendicular to the side of the opening 6 connected by the connecting part 9. The width d1 of the end of the connecting part 9 connected to the shielding part 8 is smaller than or equal to the maximum width of the shielding part 8 along the direction perpendicular to the symmetry axis L of the connecting part 9, and the width d2 of the end of the connecting part 9 connected to the side wall of the opening 6 is equal to the width d1 of the end of the connecting part 9 connected to the shielding part 8. In such a structure, the connecting part 9 is an axisymmetric structure, and can be regarded as in a quasi-rectangular shape, so that the supporting force provided by the connecting part 9 to the shielding part 8 is relatively symmetrical, and the area of the display area shielded by the connecting part 9 is relatively small.

Figure 4C:
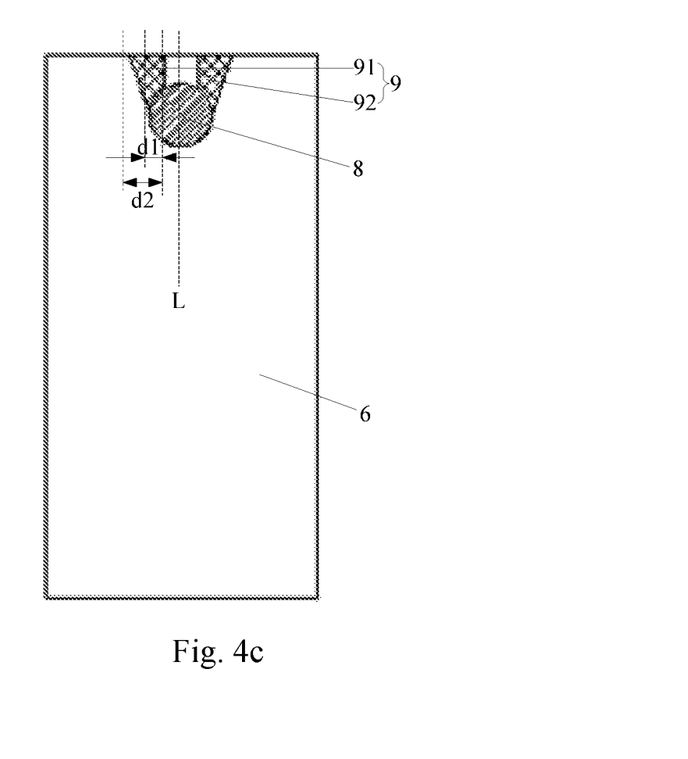

Exemplarily, as shown in FIG. 4c, the connecting part 9 includes at least two sub-connecting parts 91, 92, and a symmetry axis L of the connecting part 9 passes through a center of the shielding part 8 and is perpendicular to the side of the opening 6 connected by the connecting part 9; and all sub-connecting parts (such as the sub-connecting parts 91, 92) are distributed symmetrically about the symmetry axis L. The width d2 of an end of each sub-connecting part connected to the side wall of the opening 6 is larger than the width d1 of an end of the sub-connecting part connected to the shielding part 8. In such a structure, all sub-connecting parts 9 are distributed symmetrically about the symmetry axis L, and each sub-connecting part 9 can be regarded as in a quasi-trapezoidal shape, so that the supporting force provided by the connecting part 9 as a whole to the shielding part 8 is relatively symmetrical, and the connection between the shielding part 8 and the side wall of the opening 6 is relatively stable, and the area of the display area shielded by the connecting part 9 as a whole is relatively small.

Figure 4D:
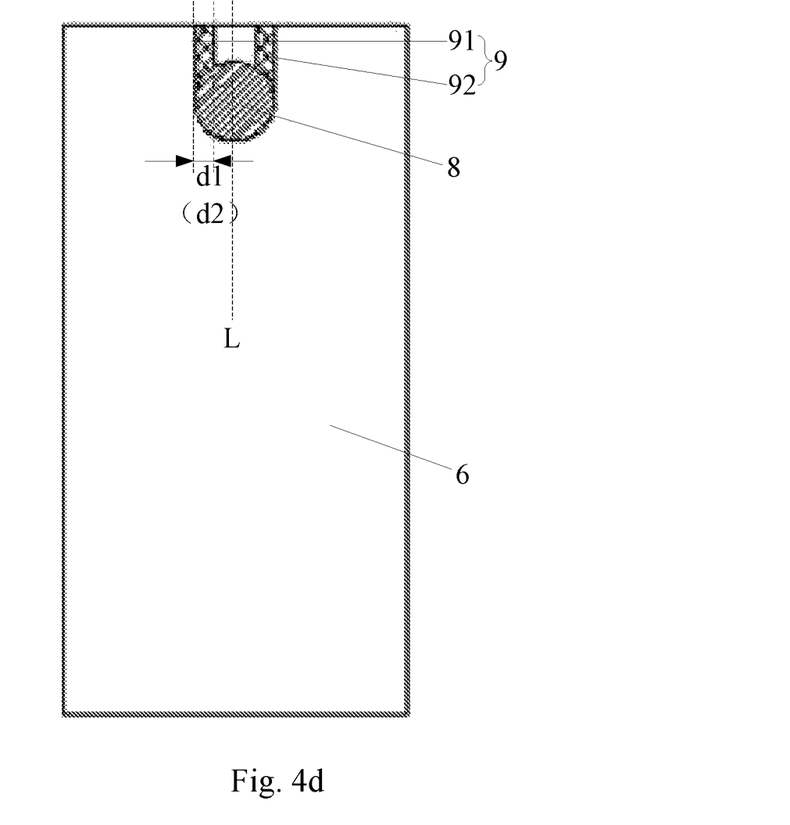

Exemplarily, as shown in FIG. 4d, the connecting part 9 includes at least two sub-connecting parts 91, 92, and a symmetry axis L of the connecting part 9 passes through a center of the shielding part 8 and is perpendicular to the side of the opening 6 connected by the connecting part 9; and all sub-connecting parts (such as the sub-connecting parts 91, 92) included in the connecting part 9 are distributed symmetrically about the symmetry axis L. The width d1 of an end of each sub-connecting part connected to the side wall of the opening 6 is equal to the width d2 of an end of the sub-connecting part connected to the shielding part 8. In such a structure, all sub-connecting parts 9 are distributed symmetrically about the symmetry axis L, and each sub-connecting part 9 can be regarded as in a quasi-rectangular shape, so that the supporting force provided by the connecting part 9 as a whole to the shielding part 8 is relatively symmetrical, and the connection between the shielding part 8 and the side wall of the opening 6 is relatively stable, and the area of the display area shielded by the connecting part 9 as a whole is relatively small.

Figure 5A:
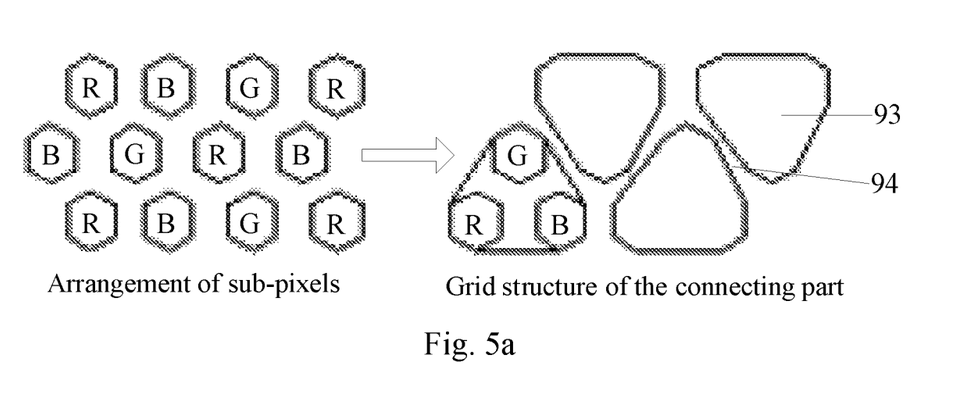
FIGS. 5a-5c are plan views of arrangements of meshes of a connecting part of a mask provided in an embodiment of the present disclosure.
Figure 5B:
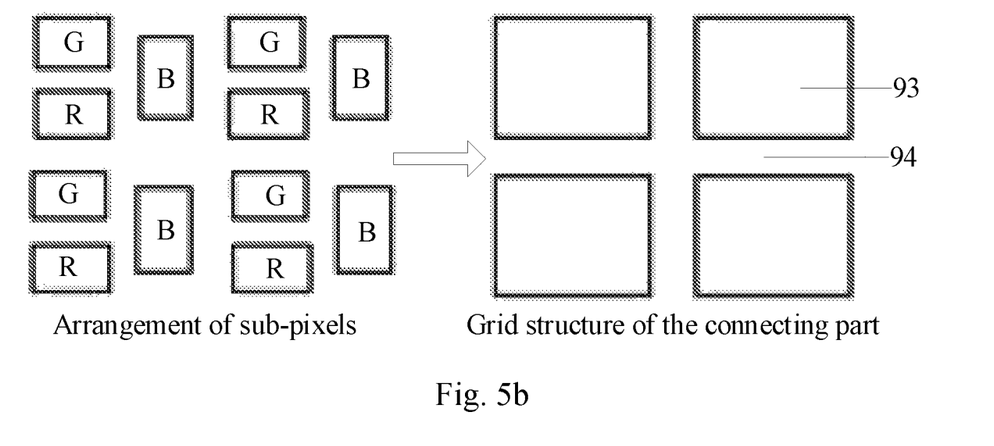
Figure 5C:
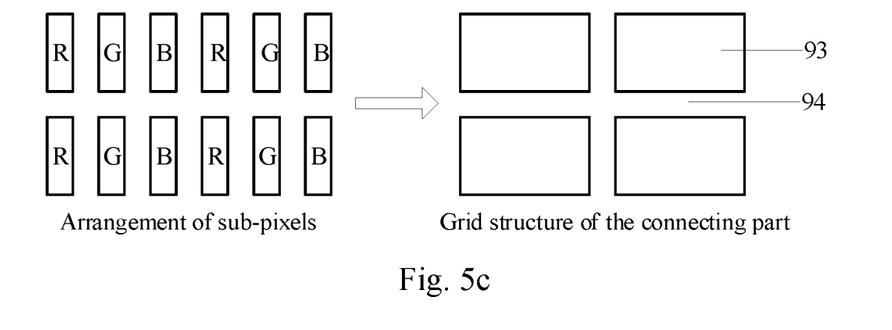

As an optional design, referring to FIGS. 5a-5c, an orthographic projection of each mesh 93 of the grid structure of the connecting part 9 on the display plane of the display screen to be fabricated covers at least one sub-pixel in a corresponding area on the display screen to be fabricated, and an orthographic projection of a physical portion 94 of the grid structure on the display plane of the display screen to be fabricated is in a gap area between sub-pixels in a corresponding area on the display screen to be fabricated. FIGS. 5a-5c respectively show three different sub-pixel arrangements, and the grid structure of the connecting part 9 can be designed correspondingly for each sub-pixel arrangement. With the above design, shielding of a sub-pixel opening area in the display area by the connecting part 9 can be further reduced, and the display effect of the display area corresponding to the connecting part 9 can be improved.

Figure 6:
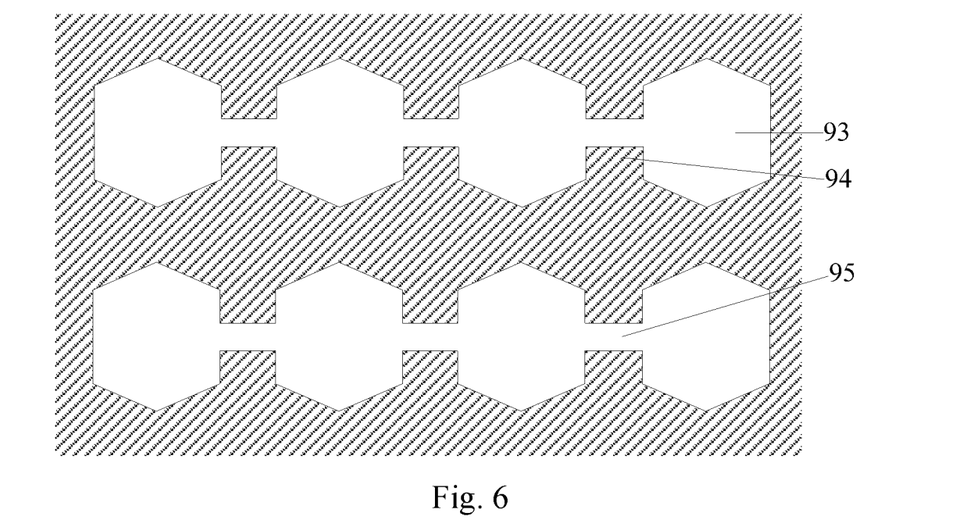
FIG. 6 is a plan view of a structure of a connecting part having a grid structure, of a mask provided in an embodiment of the present disclosure.

If the mask 300 in the embodiment is used for evaporating film layers which requires a connection in the display screen, such as evaporating cathode layers, since the connecting part 9 has a grid structure, with the meshes 93 being spaced apart from each other by the physical portion 94, thus the cathode layers evaporated in the meshes may be incommunicable with each other. With respect to this problem, as shown in FIG. 6, a notch 95 can be provided in the physical portion 94 between two adjacent meshes 93 in the grid structure of the connecting part 9, so that the notch 95 connects the two meshes 93 adjacent thereto. With such a design, during evaporation of the cathode layers, a cathode material is deposited in the notch 95 in addition to the meshes 93, thus achieving mutual electrical connection of the cathode layers in the meshes 93. Further, a notch may also be provided in the physical portion 94 between the meshes 93 located at edges and the opening 6, to achieve connection between the meshes 93 of the grid structure and the opening 6. With such a design, during evaporation, evaporated film layers formed through the grid structure are connected with film layers in an area except for the grid structure, thus achieving electrical connection of the entire layer of film.

Referring to FIG. 3 again, in the embodiments, the connecting part 9 can be connected with a side wall of the opening 6 closest to the shielding part 8 to reduce the area of the display area shielded by the connecting part 9.

In the embodiments, the substrate 5, the shielding part 8 and the connecting part 9 can be formed into an integral structure, and their materials can be invar.

In addition, in the embodiments, as an optional design, the shape of the orthographic projection of the shielding part 8 on the display plane is same as the that of the orthographic projection of the corresponding component to be shielded on the display plane, and the area of the orthographic projection of the shielding part 8 on the display plane is equal to or slightly larger than that of the orthographic projection of the corresponding component to be shielded on the display plane. In this way, the shielding part 8 can ensure that shielding of an area around the component to be shielded in the display screen can be avoided as much as possible in addition to effective shielding of the component to be shielded in the display screen, during evaporation.

It needs to be noted that in the embodiment, the number of the shielding part 8 in each opening 6 and the number of the connecting part 9 corresponding thereto are not limited to one, and the numbers depend on the number of the component to be shielded in the display screen.

In addition, the mask 300 in the embodiment may also include a metal frame 4 for supporting the substrate 5 to prevent deformation of the substrate 5.

Based on the aforementioned mask, embodiments of the present disclosure also provides a manufacturing method of a mask, and the manufacturing method includes the following steps.

S1: providing a substrate.

In the above step S1, the provided substrate can be a complete substrate, and the material of the substrate can be invar or other material that can be used for manufacturing a mask.

S2: referring to FIG. 3 again, removing a specific portion from the substrate to form at least one opening 6, a shielding part 8 and a connecting part 9 on the substrate; where an orthographic projection of the opening 6 on a display plane of a display screen to be fabricated coincides with a display area of the display screen to be fabricated; the shielding part 8 and the connecting part 9 are located inside the opening 6; an orthographic projection of the shielding part 8 on the display plane of the display screen to be fabricated coincides with an orthographic projection of a component to be shielded in the display screen to be fabricated on the display plane; and the connecting part 9 connects the shielding part 8 and a side wall of the opening 6.

In the above step S2, "removing a specific portion from the substrate" can be carried out by using a wet etching process, a laser etching process, or a combination of a wet etching process and a laser etching process.

For the technical solution in which the connecting part 9 has a grid structure:

As an optional design, the above step S2 can specifically include: removing a portion of the substrate in an area in which an opening 6 is to be formed, except for areas in which a shielding part 8 and a connecting part 9 are to be formed, by a wet etching process or a laser etching process, and making meshes in the area in which the connecting part 9 is to be formed, to form the at least one opening 6, the shielding part 8, and the connecting part 9 having a grid structure. That is to say, the opening 6, the shielding part 8, and the connecting part 9 having a grid structure can be formed in a same etching process.

As an optional design, the above step S2 can specifically include: first, removing a portion of the substrate in an area in which an opening 6 is to be formed, except for areas in which a shielding part 8 and a connecting part 9 are to be formed, by a wet etching process, to form the at least one opening 6, the shielding part 8, and a rudiment of the connecting part 9; and etching the rudiment of the connecting part 9 by a laser etching process, and making meshes in the rudiment of the connecting part 9, to obtain the connecting part 9 having a grid structure. That is to say, the opening 6, the shielding part 8, and the rudiment of the connecting part 9 can be formed in an etching process, and then the grid structure of the connecting part 9 is formed in another etching process.

It needs to be noted that etching the substrate by a laser etching process has the advantages of high etching precision and fineness.

In the solution of the grid structure of the connecting part shown in FIG. 6, a notch 95 is provided in the physical portion 94 between two adjacent meshes 93 in the grid structure, and the notch 95 can be made by laser drilling.

Figure 7A:
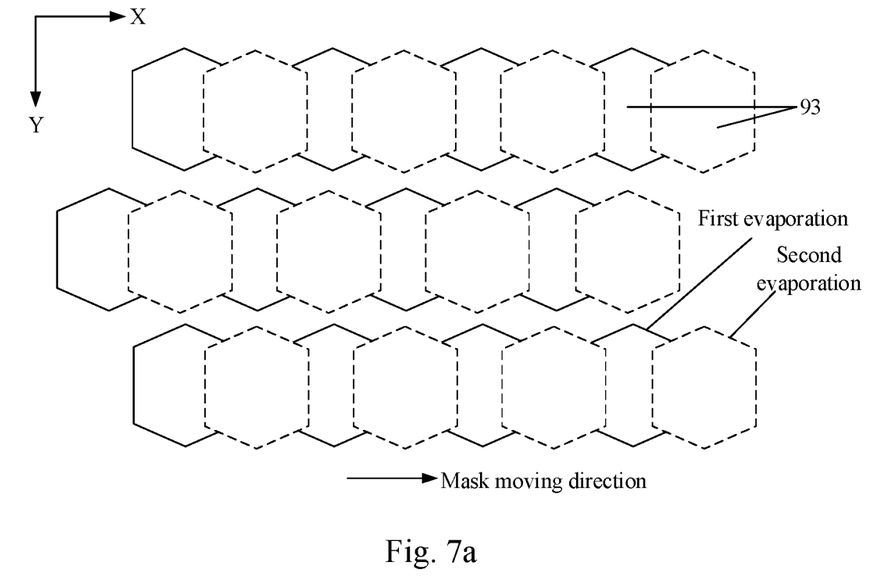
FIGS. 7a-7c are schematic diagrams illustrating three implementations of an evaporation method provided in an embodiment of the present invention.
Figure 7B:
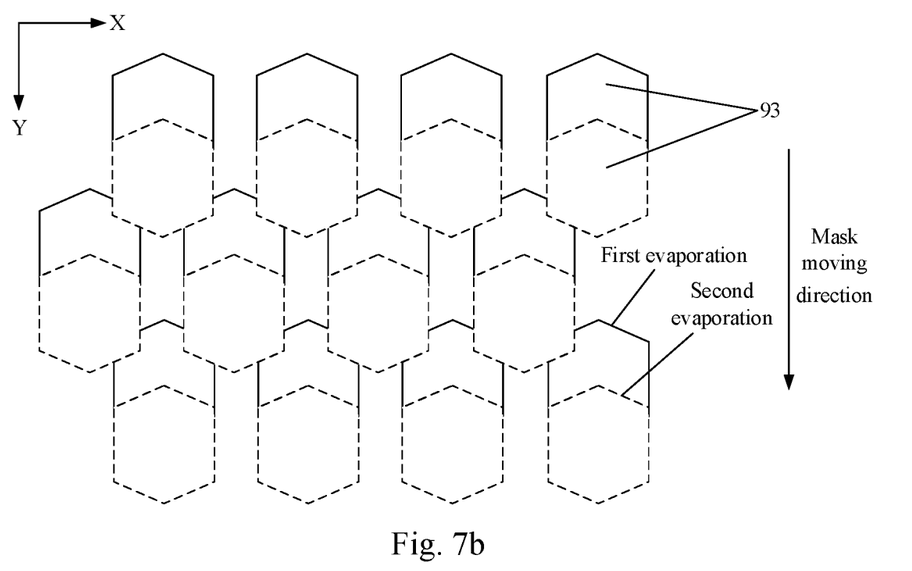
Figure 7C:
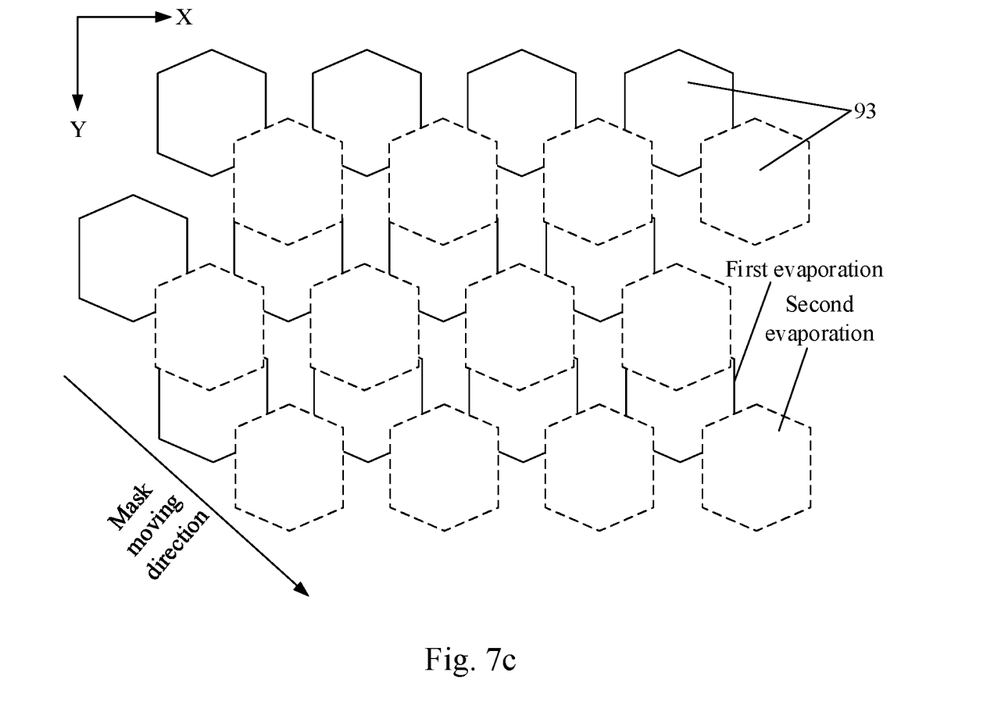
Figure 8:
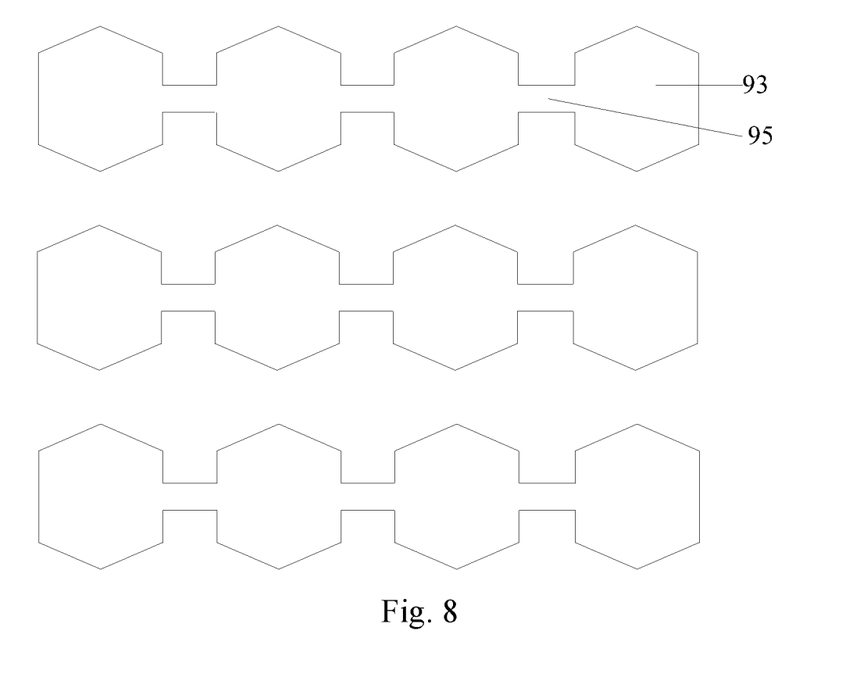
FIG. 8 is a schematic diagram illustrating another evaporation method provided in an embodiment of the present invention.

Based on the aforementioned mask with the connecting part having a grid structure, embodiments of the present disclosure further provide an evaporation method. Referring to FIGS. 7a-7c, the evaporation method includes at least two evaporation operations, where the aforementioned mask with the connecting part having a grid structure is used in each evaporation operation, and the mask is moved a set distance along a set direction after each evaporation operation and before the next evaporation operation. The set direction and the set distance depend on the arrangement of meshes 93 in the grid structure of the connecting part in the mask, so that after the at least two evaporation operations are performed, evaporated film layers in the meshes 93 (evaporated film layers formed through the meshes 93) connect with each other, and evaporated film layers in an area corresponding to the connecting part (evaporated film layers formed through the connecting part) connect with film layers in an area of the opening of the mask except for the connecting part and the shielding part, thus avoiding the problem that the evaporated film layers in the meshes 93 cannot connect with each other arising in the case that only one evaporation operation is carried out, and ensuring normal display of the display area corresponding to the connection part.

Exemplarily, see FIG. 7a, where a row direction in which the meshes 93 are arranged is an X direction, and a direction perpendicular to the X direction is a Y direction, and evaporation can be performed twice. After a first evaporation operation is completed and before a second evaporation operation is carried out, the mask is translated a certain distance in the X direction, so that the positions of the meshes 93 after translation correspond to the gaps between the meshes 93 before translation. Thus, after the second evaporation operation is carried out, in the evaporated film layers of a same row, the evaporated film layers in two adjacent meshes 93 in the first evaporation operation are connected to each other by the evaporated film layers in the meshes 93 in the second evaporation operation; furthermore, the evaporated film layers of each row are connected with evaporated film layers in areas of the opening of the mask except for the connecting part and the shielding part (evaporated film layers formed through an area in the opening except for the connecting part and the shielding part). In this way, mutual connection between the evaporated film layers in all the meshes 93 is achieved.

Exemplarily, see FIG. 7b, where a row direction in which the meshes 93 are arranged is an X direction, and a direction perpendicular to the X direction is a Y direction, and evaporation can be performed twice. After a first evaporation operation is completed and before a second evaporation operation is carried out, the mask is translated a certain distance in the Y direction, so that the positions of the meshes 93 after translation correspond to the gaps between the meshes 93 before translation. Thus, after the second evaporation operation is carried out, in the Y direction, the evaporated film layers in two adjacent meshes 93 in the first evaporation operation are connected to each other by the evaporated film layers in the meshes 93 in the second evaporation operation. In this way, mutual connection between the evaporated film layers in the meshes 93 is achieved.

Exemplarily, see FIG. 7c, where a row direction in which the meshes 93 are arranged is an X direction, and a direction perpendicular to the X direction is a Y direction, and evaporation can be performed twice. After a first evaporation operation is completed and before a second evaporation operation is carried out, the mask is translated a certain distance in a direction shown in the figure (a direction between the X direction and the Y direction), so that the positions of the meshes 93 after translation correspond to the gaps between the meshes 93 before translation. Thus, after the second evaporation operation is carried out, in the mask moving direction shown in the figure, the evaporated film layers in two adjacent meshes 93 in the first evaporation operation are connected to each other by the evaporated film layers in the meshes 93 in the second evaporation operation. In this way, mutual connection between the evaporated film layers in the meshes 93 is achieved.

The aforementioned evaporation method is suitable for evaporating film layers requiring a mutual connection in the display screen, such as cathode layers.

In addition, it is to be noted that to achieve mutual connection between the evaporated film layers in the meshes 93, the mask shown in FIG. 6 may also be adopted; that is, a notch 95 is provided in the physical portion 94 between two adjacent meshes 93 in the grid structure, such that during evaporation, the evaporation material is deposited in the notch 95 in addition to being deposited in the meshes 93, thus achieving mutual connection between the evaporated film layers in the meshes 93, and between the evaporated film layers in the meshes 93 and the evaporated film layers in areas except for the grid structure.

In addition, to achieve mutual connection between the evaporated film layers in the meshes 93, a mask with no notch 95 provided in the physical portion 94 between two adjacent meshes 93 in the grid structure may also be adopted, such as the grid structure shown in FIGS. 5a-5c, during evaporation, the diffusion effect of the evaporation material on the edges of the meshes 93 (referred to as "Shadow" in the art) can be directly used to achieve mutual connection between the evaporated film layers in the adjacent meshes 93.

To ensure that the overall thickness of the film layers evaporated by the aforementioned evaporation method conforms to a designed thickness of the film layers, a sum of the thicknesses of the film layers evaporated each time can be the designed thickness of the film layers to ensure the yield of the display screen. Exemplarily, the aforementioned evaporation method can include two evaporation operations, and a film thickness in each evaporation operation is half the designed thickness of the film layers.

Figure 9:
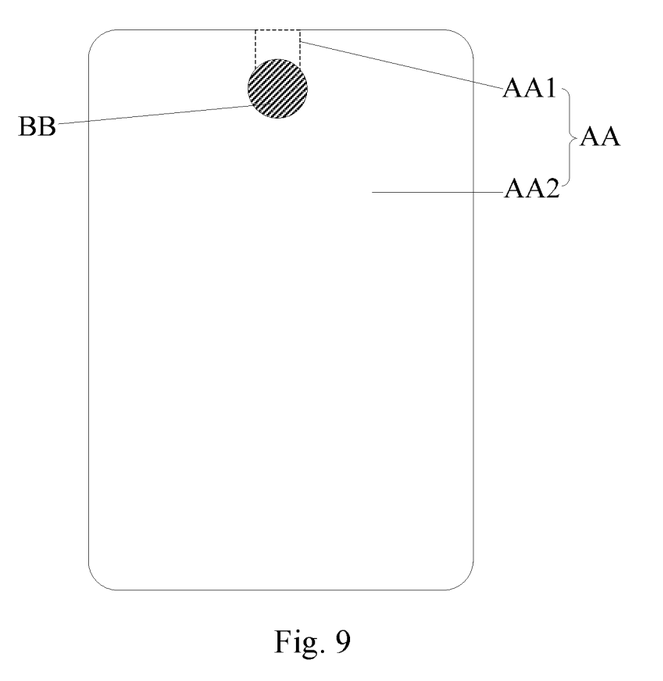
FIG. 9 is a plan view of a structure of a display screen provided in an embodiment of the present disclosure.

Based on the aforementioned mask, the embodiments further provide a display screen. As shown in FIG. 9, the display screen includes an active area AA and a functional component area BB. A functional component of the display screen, such as a camera, an earpiece, a sensor or the like, is arranged in the functional component area BB, and the shape of the functional component area BB is same as that of an orthographic projection of the functional component arranged therein on a display plane, and the area of the functional component area BB is equal to or slightly larger than that of the orthographic projection of the functional component arranged therein on the display plane; and sub-pixels are arranged in the active area AA, in which a normal display function can be achieved, and the active area AA surrounds the functional component area BB, so that normal display can be achieved in an area around the functional component area BB.

For the aforementioned display screen, the mask in any of the above embodiments can be used to make evaporated film layers, where the functional component area BB is an area shielded by the shielding part 8 during evaporation, and the active area AA is an evaporation area formed through an area in the opening 6 during evaporation; and the aforementioned display screen can achieve normal display of the area around the functional component area BB, so that the screen-to-body ratio is relatively high, and a "full screen" design can be achieved.

In the aforementioned display screen, the active area AA corresponds to an area of the opening 6 of the mask 300, and can include a connecting transitional sub-area AA1 and a non-connecting transitional sub-area AA2, where the non-connecting transitional sub-area AA2 is a main area for display; and the connecting transitional sub-area AA1 is between the functional component area BB and a side of the active area AA close thereto, and corresponds to the connecting part 9 of the mask 300. The functional component area BB corresponds to the shielding part 8 of the mask 300.

An electrode layer is provided in the active area AA, and the electrode layer can be specifically a cathode layer.

Figure 10:
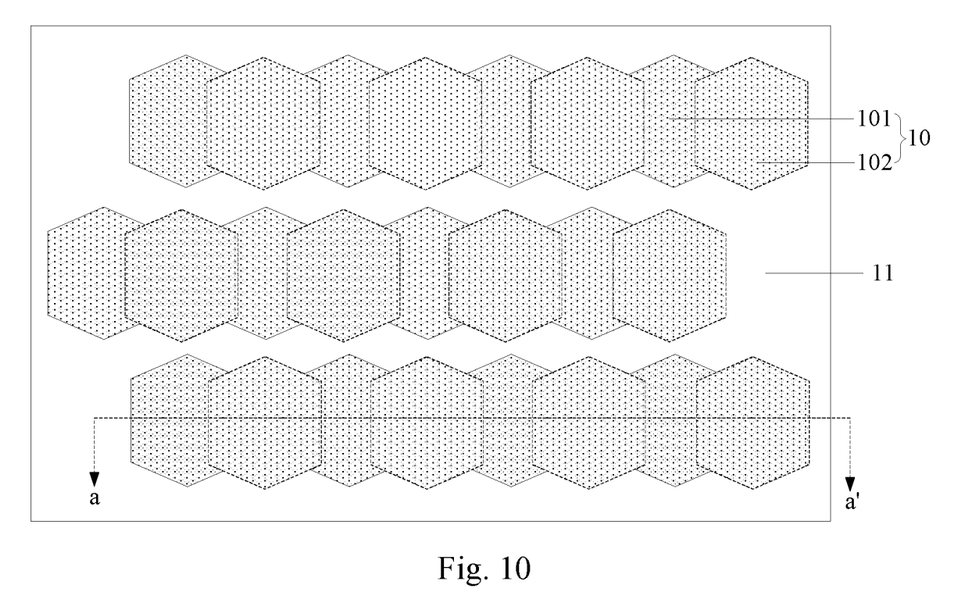
FIG. 10 is an enlarged layout view of a connecting transitional sub-area AA1 in FIG. 9.
Figure 11:
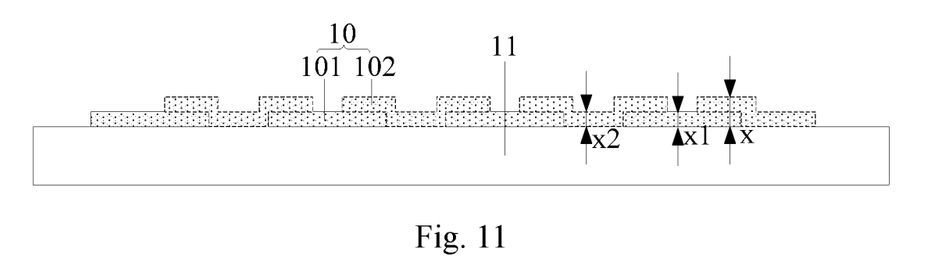
FIG. 11 is a cross-sectional view along a section line aa' of FIG. 10.

If the mask 300 adopted for manufacturing the aforementioned display screen is a mask with the connecting part 9 having a grid structure, then the electrode layer has the following features in structure: as shown in FIGS. 10 and 11, the electrode layer 10 includes at least two sub-electrode layers arranged in a stacked manner, such as sub-electrode layers 101, 102 shown in FIGS. 10 and 11. In the connecting transitional sub-area AA1, each sub-electrode layer includes a plurality of electrodes spaced apart from each other, and the plurality of electrodes included in the same sub-electrode layer are arranged in gaps between the plurality of electrodes of the adjacent sub-electrode layer; for example, FIGS. 10 and 11 show that the plurality of electrodes in the sub-electrode layer 101 are arranged in gaps between the plurality of electrodes of the sub-electrode layer 102. With such a structural design, the electrodes in the connecting transitional sub-area AA1 are electrically connected with each other.

As an optional design, the sub-electrode layer 101 can be formed in a first evaporation operation by using the mask 300, with a thickness denoted as x1; and the sub-electrode layer 102 can be formed in a second evaporation operation by using the mask 300, with a thickness denoted as x2; x1+x2 can be equal to an overall designed thickness x of the electrode layer 10; in addition, x1 and x2 may be equal. As can be seen from FIG. 11, after two evaporation operations, the thickness of the electrode layer in the connecting transitional sub-area AA1 is not uniform, with a thickness x1 or x2 in some areas and a thickness x in other areas.

Figure 12:
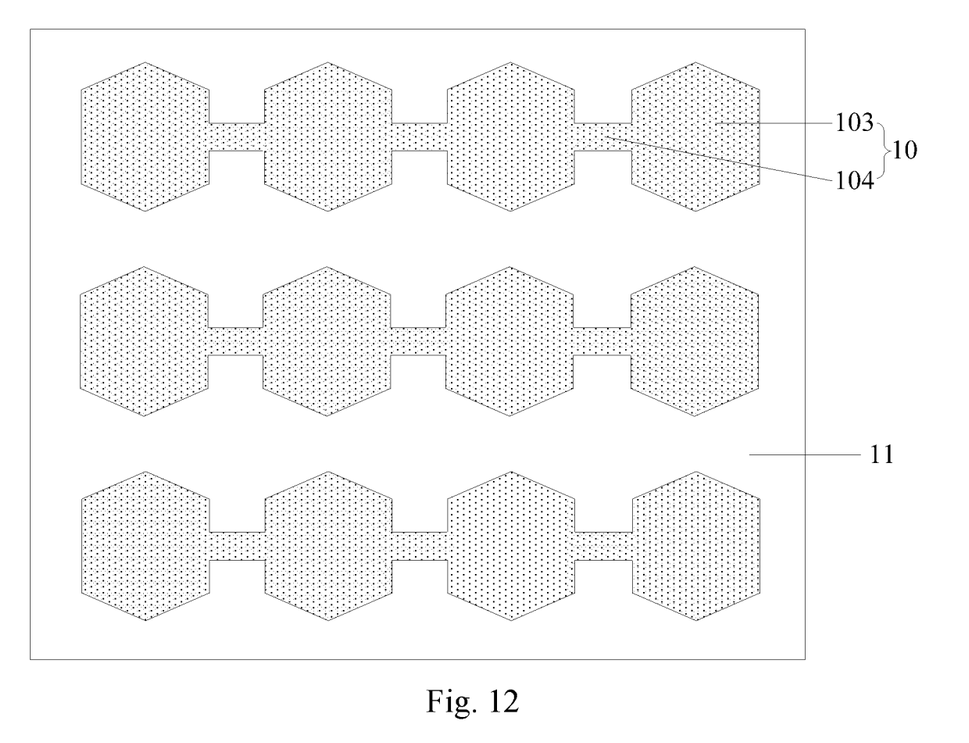
FIG. 12 is another enlarged layout view of the connecting transitional sub-area AA1 in FIG. 9.

If the mask 300 adopted for manufacturing the aforementioned display screen is a mask with the connecting part 9 having a grid structure, and a notch 95 is provided in the physical portion 94 between adjacent meshes 93 in the grid structure of the connecting part 9 (see FIG. 6), then after one evaporation operation is carried out by directly using the mask, the electrode layer has the following features in structure: as shown in FIG. 12, in the connecting transitional sub-area AA1, the electrode layer 10 includes a plurality of electrodes 103 spaced apart from each other, and adjacent electrodes 103 are electrically connected through electrode segments 104, so that the plurality of electrodes 103 are electrically connected with each other. The plurality of electrodes 103 are formed by an electrode material through the meshes 93 of the mask 300, and the electrode segments 104 are formed by electrode material through the notches 95 in the physical portion 94 of the mask 300.

Described above are only specific embodiments of the present disclosure, but the protection scope of the present disclosure is not limited thereto, and all changes or substitutions that are easily conceivable by those skilled in the art within the technical scope of the present disclosure should be encompassed within the protection scope of the present disclosure. Thus, the protection scope of the present disclosure should be defined by the claims.

The invention claimed is:

1. A mask, comprising:
   a substrate, wherein the substrate is provided with at least one opening, and an orthographic projection of the opening on a display plane of a display screen to be fabricated coincides with a display area of the display screen to be fabricated;
   a shielding part arranged inside the opening, wherein an orthographic projection of the shielding part on the display plane coincides with an orthographic projection of a component to be shielded in the display screen to be fabricated on the display plane; and
   a connecting part located between the shielding part and a side wall of the opening, for connecting the shielding part and the side wall of the opening, wherein no direct connect is between a contour line of the opening and a contour line of the shielding part;
   wherein the connecting part is an integral structure and is an axisymmetric structure, and a symmetry axis of the connecting part passes through a center of the shielding part and is perpendicular to the side wall of the opening connected by the connecting part; and
   a width of an end of the connecting part connected to the shielding part is smaller than or equal to a maximum width of the shielding part along a direction perpendicular to the symmetry axis of the connecting part, and a width of an end of the connecting part connected to the side wall of the opening is larger than or equal to the width of the end of the connecting part connected to the shielding part.

2. The mask of claim 1, wherein the connecting part has a grid structure.

3. The mask of claim 2, wherein an orthographic projection of each mesh of the grid structure on the display plane covers at least one sub-pixel on the display screen to be fabricated, and an orthographic projection of a physical portion of the grid structure on the display plane is in a gap area between sub-pixels on the display screen to be fabricated.

4. The mask of claim 3, wherein a physical portion between two adjacent meshes in the grid structure has a notch connecting the two adjacent meshes.

5. The mask of claim 1, wherein the connecting part is connected with a side wall of the opening closest to the shielding part.

6. The mask of claim 1, wherein the substrate, the shielding part and the connecting part are an integral structure.

7. The mask of claim 1, wherein a shape of the orthographic projection of the shielding part on the display plane is same as the that of the orthographic projection of the component to be shielded in the display screen to be fabricated on the display plane, and an area of the orthographic projection of the shielding part on the display plane is equal to or slightly larger than that of the orthographic projection of the component to be shielded in the display screen to be fabricated on the display plane.

8. A method for preparing the mask according to claim 1, comprising:
   providing the substrate; and
   removing a portion from the substrate to form the at least one opening on the substrate and form the shielding part and the connecting part inside the opening;
   wherein the orthographic projection of the opening on the display plane of the display screen to be fabricated coincides with the display area of the display screen to be fabricated, and the orthographic projection of the shielding part on the display plane coincides with the orthographic projection of the component to be shielded in the display screen to be fabricated on the display plane, and the connecting part connects the shielding part and the side wall of the opening;

no direct connect is between the contour line of the opening and the contour line of the shielding part;

the connecting part is the integral structure and is the axisymmetric structure, and the symmetry axis of the connecting part passes through the center of the shielding part and is perpendicular to the side wall of the opening connected by the connecting part; and the width of the end of the connecting part connected to the shielding part is smaller than or equal to the maximum width of the shielding part along the direction perpendicular to the symmetry axis of the connecting part, and the width of the end of the connecting part connected to the side wall of the opening is larger than or equal to the width of the end of the connecting part connected to the shielding part.

9. The manufacturing method of a mask of claim 8, wherein the step of removing a portion from the substrate to form at least one opening on the substrate and form a shielding part and a connecting part inside the opening comprises:

removing a portion of the substrate in an area in which an opening is to be formed, except for areas in which a shielding part and a connecting part are to be formed, by a wet etching process or a laser etching process, and making meshes in an area in which the connecting part is to be formed, to form the at least one opening, the shielding part, and the connecting part having a grid structure;

or removing a portion of the substrate in an area in which an opening is to be formed, except for areas in which a shielding part and a connecting part are to be formed, by a wet etching process, to form the at least one opening, the shielding part, and a rudiment of the connecting part; and etching the rudiment of the connecting part by a laser etching process, and making meshes in the rudiment of the connecting part, to obtain the connecting part having the grid structure.

10. An evaporation method, comprising at least two evaporation operations, a mask of claim 1 being used in each evaporation operation, wherein a connecting part in the mask has a grid structure, and the mask is moved a set distance along a set direction after each evaporation operation and before a next evaporation operation, wherein the set direction and the set distance depend on an arrangement of meshes in a grid structure of a connecting part in the mask, so that after the at least two evaporation operations are performed, evaporated film layers formed through the meshes are connected with each other, and evaporated film layer formed through the connecting part is connected with evaporated film layer formed through an area in the opening except for the connecting part and a shielding part.

11. The evaporation method of claim 10, wherein a sum of thicknesses of film layers evaporated by the at least two evaporation operations is a designed thickness of the film layer.

12. The evaporation method of claim 11, wherein the evaporation method comprises two evaporation operations, and a film thickness in each evaporation operation is half the designed thickness of the film layer.

13. A display screen, comprising an active area and a functional component area;

wherein a functional component of the display screen is arranged in the functional component area, a shape of the functional component area is same as that of an orthographic projection of the functional component arranged therein on a display plane, and an area of the functional component area is equal to or slightly larger than that of an orthographic projection of the functional component arranged therein on the display plane; and the active area surrounds the functional component area;

wherein an electrode layer is provided in the active area;

the active area comprises a connecting transitional sub-area located between the functional component area and a side of the active area closest thereto; and the electrode layer comprises at least two sub-electrode layers arranged in a stacked manner, wherein in the connecting transitional sub-area, each sub-electrode layer comprises a plurality of electrodes spaced apart from each other, and a plurality of electrodes of a same sub-electrode layer are arranged in gaps between a plurality of electrodes of an adjacent sub-electrode layer, so that the electrodes in the connecting transitional sub-area are electrically connected with each other; or in the connecting transitional sub-area, the electrode layer comprises a plurality of electrodes spaced apart from each other, and adjacent electrodes are electrically connected through an electrode segment, so that the plurality of electrodes are electrically connected with each other.

14. A mask, comprising:

a substrate, wherein the substrate is provided with at least one opening, and an orthographic projection of the opening on a display plane of a display screen to be fabricated coincides with a display area of the display screen to be fabricated;

a shielding part arranged inside the opening, wherein an orthographic projection of the shielding part on the display plane coincides with an orthographic projection of a component to be shielded in the display screen to be fabricated on the display plane; and a connecting part located between the shielding part and a side wall of the opening, for connecting the shielding part and the side wall of the opening, wherein no direct connect is between a contour line of the opening and a contour line of the shielding part;

wherein the connecting part comprises at least two independent sub-connecting parts and is an axisymmetric structure, and a symmetry axis of the connecting part passes through a center of the shielding part and is perpendicular to the side wall of the opening connected by the connecting part; and the at least two sub-connecting parts are arranged symmetrically about the symmetry axis; and a width of an end of each sub-connecting part connected to the side wall of the opening is larger than or equal to a width of an end of the sub-connecting part connected to the shielding part.

15. The mask of claim 14, wherein the connecting part has a grid structure.

16. The mask of claim 15, wherein an orthographic projection of each mesh of the grid structure on the display plane covers at least one sub-pixel on the display screen to be fabricated, and an orthographic projection of a physical portion of the grid structure on the display plane is in a gap area between sub-pixels on the display screen to be fabricated.

17. The mask of claim 16, wherein a physical portion between two adjacent meshes in the grid structure has a notch connecting the two adjacent meshes.

18. The mask of claim 14, wherein the connecting part is connected with a side wall of the opening closest to the shielding part.

19. The mask of claim 14, wherein the substrate, the shielding part and the connecting part are an integral structure.

20. A method for preparing the mask according to claim 14, comprising:
   providing the substrate; and
   removing a portion from the substrate to form the at least one opening on the substrate and form the shielding part and the connecting part inside the opening;
   wherein the orthographic projection of the opening on the display plane of the display screen to be fabricated coincides with the display area of the display screen to be fabricated, and the orthographic projection of the shielding part on the display plane coincides with the orthographic projection of the component to be shielded in the display screen to be fabricated on the display plane, and the connecting part connects the shielding part and the side wall of the opening;
   no direct connect is between the contour line of the opening and the contour line of the shielding part;
   wherein the connecting part comprises at least two independent sub-connecting parts and is the axisymmetric structure, and the symmetry axis of the connecting part passes through the center of the shielding part and is perpendicular to the side wall of the opening connected by the connecting part; and the at least two sub-connecting parts are arranged symmetrically about the symmetry axis; and
   the width of the end of each sub-connecting part connected to the side wall of the opening is larger than or equal to the width of the end of the sub-connecting part connected to the shielding part.

* * * * *